United States Patent [19]
Tohda et al.

[11] Patent Number: 5,914,359
[45] Date of Patent: Jun. 22, 1999

[54] COLORING COMPOSITION FOR USE IN FORMATION OF TRANSPARENT COLORED MICRO-PATTERNS AND APPLICATION THEREOF

[75] Inventors: Kazuo Tohda, Funabashi; Kaori Yamamoto, Amagasaki; Kiyoharu Nakatsuka, Toyonaka, all of Japan

[73] Assignee: Sumitomo Chemical Company, Limited, Osaka, Japan

[21] Appl. No.: 08/847,229

[22] Filed: May 1, 1997

Related U.S. Application Data

[62] Division of application No. 08/455,039, May 31, 1995, abandoned.

[30] Foreign Application Priority Data

Jul. 8, 1994 [JP] Japan ................................ 6-180558

[51] Int. Cl.$^6$ ...................................................... G08K 3/34
[52] U.S. Cl. ........................... 524/88; 524/425; 524/432; 524/445; 524/451; 524/493
[58] Field of Search ............................. 524/88, 425, 432, 524/445, 457, 493

[56] References Cited

U.S. PATENT DOCUMENTS

| | | | |
|---|---|---|---|
| 4,497,888 | 2/1985 | Nishioka et al. | 430/165 |
| 4,579,806 | 4/1986 | Schupp et al. | 430/280.1 |
| 4,677,004 | 6/1987 | Das et al. | 427/407.1 |
| 4,680,204 | 7/1987 | Das et al. | 427/407.1 |

FOREIGN PATENT DOCUMENTS

| | | |
|---|---|---|
| 3-244588 | 10/1991 | Japan . |
| 04329545 | 11/1992 | Japan . |
| 6-51522 | 2/1994 | Japan . |

*Primary Examiner*—Marion McCamish
*Assistant Examiner*—John J. Guarriello
*Attorney, Agent, or Firm*—Stevens, Davis, Miller & Mosher, L.L.P.

[57] ABSTRACT

Coloring compositions for use in the formation of transparent colored micro-patterns are provided. They comprise colorants, thermosetting or photosensitive resin materials and extenders having an average particle size of not more than 300 nm. The compositions are useful for the fabrication of color filters to be used for display elements such as liquid crystal display (LCD) and solid state imaging devices such as charge-coupled device (CCD). The formed patterns have lower fluctuation in colored layer thickness all over the patterns, superior layer flatness, color levelness and sharpness of pattern boundaries, as well as large purity, clarity and color brightness.

6 Claims, No Drawings

COLORING COMPOSITION FOR USE IN FORMATION OF TRANSPARENT COLORED MICRO-PATTERNS AND APPLICATION THEREOF

This application is a Divisional Application of application Ser. No. 08/455,039, filed May 31, 1995 now abandoned.

The present invention relates to coloring compositions for use in formation of transparent colored micro-patterns, and to application thereof.

More specifically, the invention relates to a coloring composition for use in the fabrication of a substrate having transparent colored micro-patterns on the surface thereof, which can be used as color filters.

The color filters are particularly useful for display elements such as liquid crystal displays (LCD), and solid state imaging devices such as charge-coupled devices (CCD).

The formation of transparent colored micro-patterns on glass or other transparent substrates has been performed according to a printing method, a pigment dispersion method, an electrodeposition method or the like using a coloring composition containing colorants and thermosetting or photosensitive resin materials.

According to the printing method, the colored micro-patterns are formed on a transparent substrate directly by printing with a printing ink.

The pigment dispersion method is carried out, for example, by forming a pigment-dispersed photoresist layer on a transparent substrate using a photoresist composition containing pigments and photosensitive resin materials and then patterning the formed layer photolithographically. The electrodeposition method is carried out by forming fine electroconductive circuits insulated from one another on a transparent substrate and then forming colored patterns on the formed circuits by electrodeposition using an electrodeposition bath containing colorants and resin materials as mentioned in, for example, U.S. Pat. No. 4,522,691 or JP-A-59-114572. The electrodeposition method is also carried out by using a transparent substrate provided with an electroconductive layer not patterned into circuits, as taught in, for example, U.S. Pat. No. 4,902,592 or JP-A-64-22379.

When a substrate having transparent colored micro-patterns on the surface thereof is used as the color filter, particularly, for display elements, the transparent colored micro-patterns are required to have smaller fluctuation in colored layer thickness all over the micro-patterns, and superior in layer flatness, color levelness, sharpness of pattern boundaries, and purity, clarity and brightness in color.

In order to improve layer flatness, there are some methods which comprise forming transparent colored micro-patterns according to any one of the above-mentioned known methods, and then leveling the surface of colored patterns by means of hot-rollers, or polishing the surface with abrasives. However, the methods are not advantageous from an industrial point of view, because productivity is remarkably small.

Taking note of the electrodeposition method capable of giving the colored micro-patterns selectively on electroconductive circuits with high precision, U.S. Pat. No. 4,812,387 (JP-A-62-247331) teaches a method wherein light screening coating layers are interlaced between the colored patterns, in order to improve the color levelness and sharpness of pattern boundaries. That is, the method is conducted by forming colored layers on electroconductive circuits of a substrate by electrodeposition according to a method mentioned in, for example, the afore-mentioned U.S. Pat. No. 4,522,691, coating a negative photoresist compositon containing a light screening material on the whole surface of the substrate including the formed colored layers until a light screening photoresist layer is formed, and then exposing the resulting photoresist layer to light emitted from the side opposite to the photoresist layer-carrying surface of the substrate, in which process each colored layer functions as a photomask, followed by development in order to eliminate the unexposed portion of the photoresist layer. Although the method improves somewhat color levelness and sharpness of pattern boundaries, further improvement has been desired.

Furthermore, U.S. Pat. No. 4,781,444 (JP-A-60-184696) proposes a method for solving various problems, such as insufficiency in color levelness and color clarity and inevitable pattern shifting in the printing method, complexity in the pigment dispersion method, and color fading of colored patterns in the electrodeposition method. The method is characterized in that a colorant and a resin material are chemically bonded in colored patterns formed by the electrodeposition method wherein a reactive dye capable of chemically bonding with the resin material is used as the colorant. However, the method fails to fully meet the above-mentioned requirements for the color filter.

The present inventors have undertaken extensive studies to find coloring compositions capable of solving the above-mentioned various problems and giving transparent colored micro-patterns which can be put into practical use as the color filters particularly usable in the display elements. As the result, the inventors have found that the objects can be accomplished by using a specific extender, and attained to the present invention.

The present invention provides a coloring composition for use in the formation of transparent colored micro-patterns, which comprises colorants, thermosetting or photosensitive resin materials and extenders having an average particle size of not more than 300 nm. The present invention further provides a method for fabricating a substrate having transparent colored micro-patterns on the surface thereof using the said coloring composition, more specifically, a method in which transparent colored micro-patterns are formed on the surface of a transparent substrate by a printing method, a pigment dispersion method or an electrodeposition method using the said coloring composition.

The present invention is explained in detail as follows.

The colorants used in the present invention are at least one member selected from dyes and organic or inorganic pigments. All known dyes and pigments can be used as far as they have desired spectral absorption constants and are transparent and sufficiently durable for practical use.

The dyes include, for example, acid dyes, reactive dyes, direct dyes, basic dyes, disperse dyes or solvent dyes. The pigments include, for example, azo lake, insoluble azo, condensed azo, phthalocyanine, quinacridone, dioxazine, isoindolinone, isoindolin, anthraquinone, perylene and thio-indigo pigments, lakes of acid or basic dyes, or known inorganic pigments. Of these coloring materials, preferred are pigments from a viewpoint of heat resistance.

The resin materials used in the present invention are not particularly limited. Any resin materials usually used in this art may be used.

Examples of the thermosetting resin materials are maleinated oil, acryl, polyester, polybutadiene, polyolefin, phenol novolak, polyimide, polyvinyl alcohol, modified acryl, modified epoxy or modified silicone resins. The thermosetting resin materials may be used each alone or in combination of two or more.

Examples of the photosensitive resin materials are mixtures of the above-exemplified resins with photosensitive compounds such as photo-curable acrylates or methacrylates (herein referred to "(meth)acrylates" or so) including, for example, trimethylolpropane tri(meth)acrylate or di-trimethylolpropane hexa(meth)acrylate. Alternatively, they are, for example, oligomers including, for example, urethane(meth)acrylate or polyester(meth)acrylate. Other examples of photosensitive resin materials are photo-curable resins such as a resin obtainable by a reaction between linseed oil or polybutadiene and hydroxyl-containing (meth)acryloyl monomers such as 2-hydroxyethyl(meth)acrylate to form a half ester; a resin obtainable by an addition-reaction between epoxy resins and (meth)acrylic acid, followed by esterification with poly-basic acids; a resin obtainable by a reaction between high acid value polymers and glycidyl (meth)acrylate; and a resin obtainable by an addition-reaction between water-soluble polyester resins and hydroxyl-containing (meth)acryloyl monomers such as 2-hydroxyethyl(meth)acrylate in the presence of diisocyanate.

The photosensitive resin materials may be used each alone or in combination of two or more.

The resin materials also include negative or positive photoresist compositions known and used usually in a pigment dispersion method or others.

The extenders used in the present invention are not particularly limited in its kind as far as they are colorless or white in color. They include those known as extender pigments. Preferred examples are zinc white; lithopone; calcium carbonate including heavy calcium carbonate, chalk and Paris white; barium sulfate including precipitated barium sulfate and barite; barium carbonate; sodium sulfate including gypsum and light spar; asbestos; clay including China clay, kaolin and terra abla; silica powder including silicic acid fine powder and white carbon; diatomaceous earth; talc; basic magnesium carbonate; alumina white including aluminum hydroxide; gloss white including alumina-blanc fix; satin white and cerium oxide. The extenders may be used each alone or in combination of two or more.

The extenders have an average particle size of not more than 300 nm, preferably not more than 100 nm. The narrower distribution of the particle size, the better. Particularly, it is desired to avoid contamination of particles having a particle size of 500 nm or more. The upper limit of the particles having a particle size of 500 nm or more is preferably about 7% by weight based on the weight of the extender. On the other hand, when the particle size is too small, such as less than about 5 nm, desired effects may hardly be expected. Therefore, the average particle size of the extenders used in the present invention ranges preferably from 5 nm through 300 nm, more preferably from about 7 nm through about 100 nm.

The average particle size of extenders to be used in the present invention can be measured by a conventional manner such as light scattering method, X-ray scattering method, specific surface measuring method or electron-microscopical method.

The shape of particles of the extenders may be spherical, near-spherical, plate, stick, needle or other forms. The particle size of those having shapes different from spherical or near-spherical form can be substituted by a particle size of a sphere having the same volume as those, namely an equivarent sphere. In this case, the particle size can be expressed by that of the equivalent sphere measured by a light or X-ray scattering method or electron-microscopical method.

In preparing the coloring compositions of the present invention, the weight ratio of the colorants and the thermosetting or photosensitive resin materials can be determined within the range known in this art. For example, when the coloring compositions are used for the formation of colored micro-patterns by the electrodeposition method, the weight ratio of the coloring materials to the resin materials ranges from about 1 to 2 through about 1 to 20.

Although the amount of the extenders to be used varies depending on the varieties and particle size thereof or the varieties and amount of the coloring materials, it ranges preferably from about 0.03 through about 20% by weight, more preferably from about 0.1 through about 15% by weight, based on the weight of the micro-patterns formed using the coloring compositions of the present invention. Too small amounts give sometimes insufficient results, and on the other hand too large amounts lose sometimes transparency and layer flatness.

The coloring compositions of the present invention can readily be prepared, for example, by mixing the colorants, the thermosetting or photosensitive resin materials and the extenders, if desired, in the presence of solvents or additives usually used in this art in a conventional manner with use of roll mills, ball mills, sand mills, beads mills or the like.

The solvents include, for example, water or organic solvents such as alcohols, cellosolves, esters, hydrocarbons or the like, which are used each alone or in combination of two or more. The amount of the solvents can be determined suitably within the range applied in this art.

The additives include, for example, dispersants, pH control agents, anti-forming agents, coating film leveling agents or the like, which are used each alone or in combination of two or more. The amount of the additives can be determined suitably within the range applied in this art depending on the varieties of the additives.

The thus obtained coloring compositions are used for the formation of transparent colored micro-patterns on a transparent substrate such as glass. The formation of the micro-patterns can be carried out by the above-mentioned known methods of printing, pigment dispersion or electrodeposition methods. of these methods, the electrodeposition method is preferable from the viewpoint of superiority in fluctuation in colored layer thickness, layer flatness, patterning precision, pattern formation cost or the like.

The electrodeposition method can be carried out in manners mentioned in the specification of the above-mentioned prior arts using a transparent substrate having, on the surface thereof, an electroconductive layer optionally patterned into circuits.

According to the present invention, coloring compositions are obtained, which give, with industrial advantages, transparent colored micro-patterns having lower fluctuation in colored layer thickness all over the patterns, superior layer flatness, color levelness and sharpness of pattern boundaries, as well as large purity, clarity and brightness in color.

The present invention is explained in more detail with reference to the following Example, which is only illustrative, but not limitative for the present invention.

EXAMPLE

Phthalocyanine blue SR-150 (manufactured and sold by Sanyo Color Works in Japan), Phthalocyanine green SAX (ditto) or a mixture of Pigment red 4BS (ditto) with transparent iron oxide (TOR, sold by Dainichiseika Color & Chemicals Mfg. Co. in Japan), as colorants, and Aerosil 200 CF (silica powder having an average particle size of 12 nm, sold by Aerosil Nippon Co. in Japan) or Finex 50 (zinc white having an average particle size of 20 nm, manufactured and sold by Sakai Chemical Industry Co. in Japan) as extenders, were mixed in a weight ratio as shown in the following Table together with a suitable amount of methyl cellosolve to obtain a blue, green or red pigment composition, respectively.

Numerals in the following Table are weight ratios of the above ingredients when the weight of transparent micro-patterns formed on the transparent substrate by the following method is assigned as 100.

TABLE

| Ingredients | Pigment composition | | |
|---|---|---|---|
| | Red | Green | Blue |
| Phthalocyanine blue | 0 | 0 | 18 |
| Phthalocyanine green | 0 | 27 | 0 |
| Pigment red | 17 | 0 | 0 |
| Iron oxide | 12 | 0 | 0 |
| Silica powder | 0.1 | 0 | 0 |
| Zinc white | 0 | 1.2 | 5.0 |

On the other hand, an aqueous resin solution comprising water and Esbia ED #3000 Clear* in a weight ratio of 120:5 was prepared.

* Esbia ED #3000 Clear: a paint for electrodepositon manufactured and sold by Shinto Paint Co. in Japan, and composed of 70% by weight of a resin mixture of water-soluble polyester resin and water-soluble melamine resin, and 30% by weight of a solvent mixture of butyl cellosolve, ethyl cellosolve and n-butanol.

The aqueous resin solution was mixed with each pigment composition obtained above to prepare blue, green or red electrodeposition baths, respectively.

Into the electrodeposition bath was dipped a glass substrate of 1.1 mm thick having, on the surface, tin oxide (ITO) circuits of 60 Ω/square in a stripe form of a width of 80 μm at a distance of 20 μm (100 μm pitch). Electrodeposition was carried out three times using the electrodeposition baths, respectively, under conditions of 10 V and 3 minutes in a conventional manner, whereby transparent multi-colored (red-, green- or blue-colored) layers were formed respectively on the stripe form circuits.

Then, light-screening layers (black matrices) were formed in the gaps of transparent multi-colored layers by a method mentioned in Example 1 of the afore-mentioned U.S. Pat. No. 4,812,387.

The resulting transparent multi-colored micro-patterns had lower fluctuation in colored layer thickness and superior layer flatness, color levelness and sharpness of pattern boundaries, as well as large purity, clarity and color brightness. The glass substrate having the black matrices interlaced between the colored patterns was superior in light-leak prevention property.

We claim:

1. A coloring composition for use in the formation of transparent colored micro-patterns, which comprises colorants, thermosetting or photosensitive resin materials and extenders having an average particle size of not more than 300 nm; the weight ratio of the colorants to the resin materials ranges from about 1 to 2 through about 1 to 20.

2. A coloring composition according to claim 1, wherein the average particle size of the extenders ranges from about 5 nm through 300 nm.

3. A coloring composition according to 1, wherein the extenders have a particle size of less than 500 nm.

4. A coloring composition according to claim 1, wherein the extenders contain those having a particle size of not less than 500 nm in an amount of not more than about 7% by weight based on the weight of the extender.

5. A coloring composition according to claim 1, wherein the amount of extenders is from about 0.03 through about 20% by weight based on the weight of the micro-patterns formed using the coloring composition.

6. A coloring composition according to claim 1, wherein the extenders are at least one member selected from zinc white, lithopone, calcium carbonate, barium sulfate, barium carbonate, sodium sulfate, asbestos, clay, silica powder, diatomaceous earth, talc, basic magnesium carbonate, alumina white, gloss white, satin white and cerium oxide.

* * * * *